(12) United States Patent
Doblar

(10) Patent No.: US 6,614,862 B1
(45) Date of Patent: Sep. 2, 2003

(54) ENCODED CLOCKS TO DISTRIBUTE MULTIPLE CLOCK SIGNALS TO MULTIPLE DEVICES IN A COMPUTER SYSTEM

(75) Inventor: Drew G. Doblar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/476,721

(22) Filed: Dec. 30, 1999

(51) Int. Cl.[7] ............................................... H04L 7/00
(52) U.S. Cl. ........................ 375/354; 713/600; 713/500
(58) Field of Search ............................. 375/354, 356, 375/357; 713/400, 401, 500, 501, 503, 600, 601; 327/291, 293

(56) References Cited

U.S. PATENT DOCUMENTS

| | | |
|---|---|---|
| 3,725,793 A | 4/1973 | Phillips |
| 4,807,259 A * | 2/1989 | Yamanaka et al. .......... 375/358 |
| 4,929,854 A | 5/1990 | Iino et al. |
| 4,970,405 A | 11/1990 | Hagiwara |
| 4,989,175 A | 1/1991 | Boris et al. |
| 5,058,132 A | 10/1991 | Li |
| 5,256,994 A | 10/1993 | Langendorf |
| 5,307,381 A | 4/1994 | Ahuja |
| 5,668,492 A * | 9/1997 | Pedersen et al. ............ 327/291 |
| 5,822,381 A * | 10/1998 | Parry et al. .................. 375/356 |
| 6,049,886 A * | 4/2000 | Motoyama ................... 713/400 |
| 6,288,589 B1 * | 9/2001 | Potter et al. ................. 327/295 |

FOREIGN PATENT DOCUMENTS

FR      1 527 160      9/1975

* cited by examiner

*Primary Examiner*—Phuong Phu
(74) *Attorney, Agent, or Firm*—Meyertons Hood Kivlin Kowert & Goetzel, P.C.; B. Noël Kivlin

(57) ABSTRACT

An apparatus and method for distributing multiple clock signals to multiple devices using an encoded clock signal is provided. A source clock signal can be encoded to result in an encoded system clock. The encoded system clock can be distributed to multiple devices in a computer system. The devices can decode the encoded system clock signal to generate a system clock signal and a global clock signal. The system clock signal and the global clock signal can then be distributed to their respective clock loads on each device. In certain embodiments, additional information, such as state information, can be encoded into the encoded system clock. A device can be configured to decode the additional information and can alter its state accordingly.

22 Claims, 15 Drawing Sheets

ENCODED CLOCKS TO DISTRIBUTE MULTIPLE CLOCK SIGNALS TO MULTIPLE DEVICES IN A COMPUTER SYSTEM

BACKGROUND OF THE INVENTION

1. Field of the Invention

This invention relates generally to the field of computer systems and, more particularly, to encoded signals within computer systems.

2. Description of the Related Art

Computer systems typically include one or more clock signals. The clock signals are provided to a myriad of devices in the computer system in order to synchronize the operation of the system. Once a clock signal is generated within a computer system, it needs to be distributed to each device in the computer system that uses the clock signal. Clock signals are generally distributed using physical connections on printed circuit boards (pcb's) to pin connections on integrated circuits. A clock signal may require a clock fanout buffer to generate sufficient power to distribute the clock signal throughout the system. This infrastructure required to support a clock distribution can be referred to as a clock distribution domain. Infrastructure costs can become high when a large number of devices is introduced into a computer system.

Computer systems may include a large number of devices that require multiple clock signals. These devices may require multiple clock signals where the signals operate at different frequencies. In traditional systems, additional clock distribution domains are included to generate a distribute the additional clock signal to the devices. The additional clock distribution domains can introduce additional infrastructure costs into the computer system. The additional costs become particularly troublesome in computer systems that support a large number of devices. A system is needed that can distribute multiple clock signals to multiple devices while minimizing the clock infrastructure needed to support multiple clock domains.

SUMMARY

The problems outlined above are in large part solved by the use the apparatus and method described herein. Generally speaking, an apparatus and method for distributing multiple clock signals to multiple devices using an encoded clock signal is provided. A source clock signal can be encoded to result in an encoded system clock. The encoded system clock can be distributed to multiple devices in a computer system. The devices can decode the encoded system clock signal to generate a system clock signal and a global clock signal. The system clock signal and the global clock signal can then be distributed to their respective clock loads on each device. In certain embodiments, additional information, such as state information, can be encoded into the encoded system clock. A device can be configured to decode the additional information and can alter its state accordingly.

BRIEF DESCRIPTION OF THE DRAWINGS

Other objects and advantages of the invention will become apparent upon reading the following detailed description and upon reference to the accompanying drawings in which.

Figure 1:
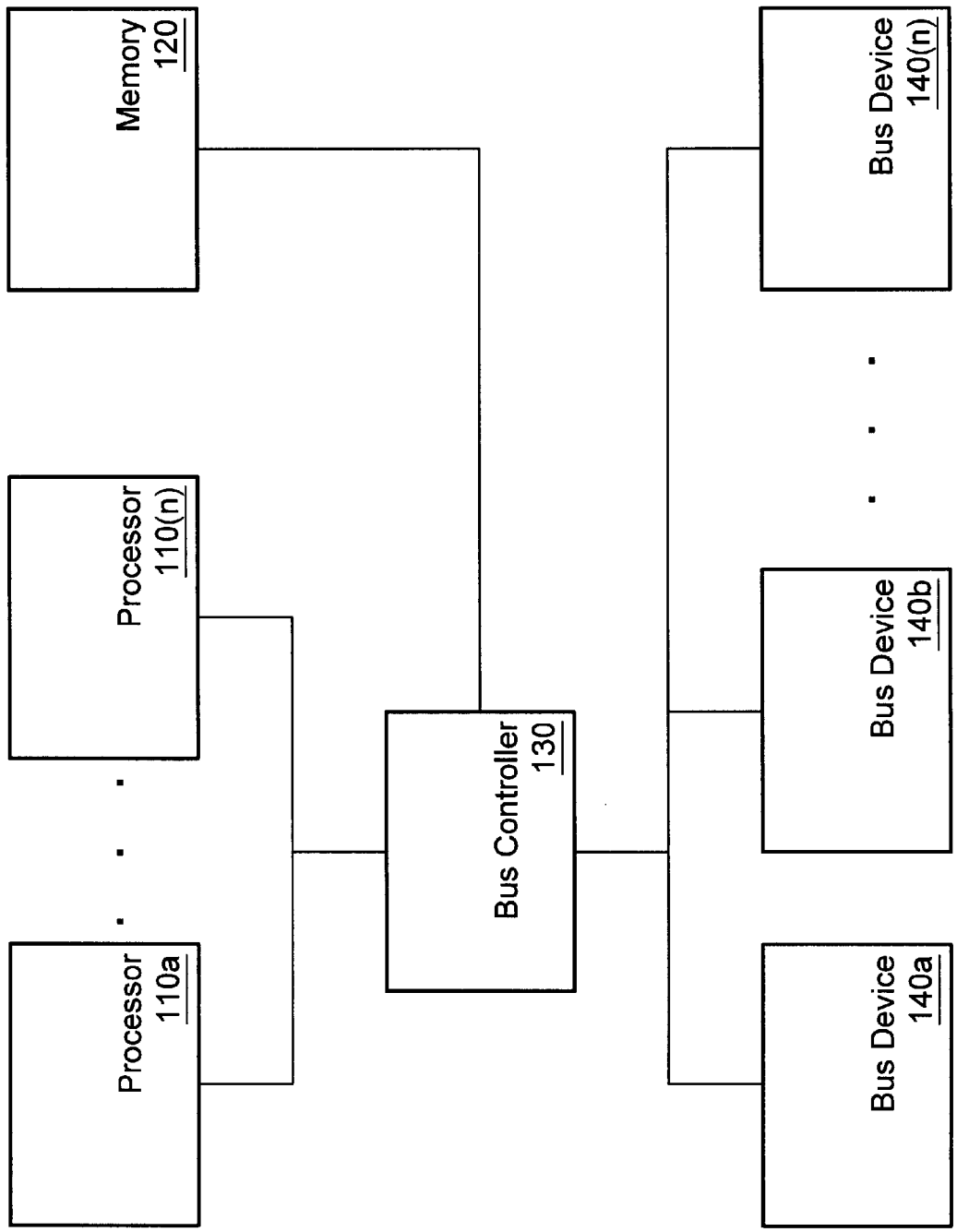
FIG. 1 is a block diagram illustrating one embodiment of a computer system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF AN EMBODIMENT

Turning now to FIG. 1, a block diagram illustrating one embodiment of a computer system is shown. Other embodiments are possible and contemplated. FIG. 1 depicts processors 110a–110(n), memory 120, and bus devices 140a–140(n) coupled to bus controller 130. Processors 110–110(n) and bus devices 140a–140(n) will be referred to collectively as processors 110 and bus devices 140, respectively. Processors 110–110(n) and bus devices 140a–140(n) will be referred to individually as processor 110 and bus device 140, respectively. The computer system of FIG. 1 can be configured to include any number of processors 110 and bus devices 140. Memory 120 can include one or more memory levels that are comprised of any suitable memory device.

In the embodiment of FIG. 1, bus devices 140 can operate according to a system clock and a global clock that are synchronized. In one embodiment, the global clock can operate at a slower clock rate than the system clock. For example, the system clock rate may operate at a clock rate that is four times the clock rate of the global clock. In one specific embodiment, the system clock can operate at 250 MHz and the global clock can operate at 62.5 MHz. In other embodiments, the ratio of the system clock rate to the global clock rate can correspond to other whole numbers. In one embodiment, signals such as synchronous resets, global signals, and flow control signals can be synchronized with the global clock. In other embodiments, other signals can be synchronized with the system clock and/or the global clock. While the system clock and the global clock could be physically distributed to each bus device 140, this solution may require the infrastructure cost of supporting two clock distribution domains. The infrastructure cost could include additional connector pins, PCB (printed circuit board) layers, and clock fanout buffers and could increase with the number of bus devices 140.

In the embodiment of FIG. 1, a clock generator that generates a system clock signal can be configured to encode the system clock signal with phase information of the global clock. The encoded system clock signal can be distributed to throughout the system to bus devices 140. Bus devices 140 can each be configured to decode the encoded system clock signal to generate a global clock signal and a system clock signal. Accordingly, the system of FIG. 1 can provide multiple clock signals to bus devices 140 using a single clock distribution domain.

Figure 2:
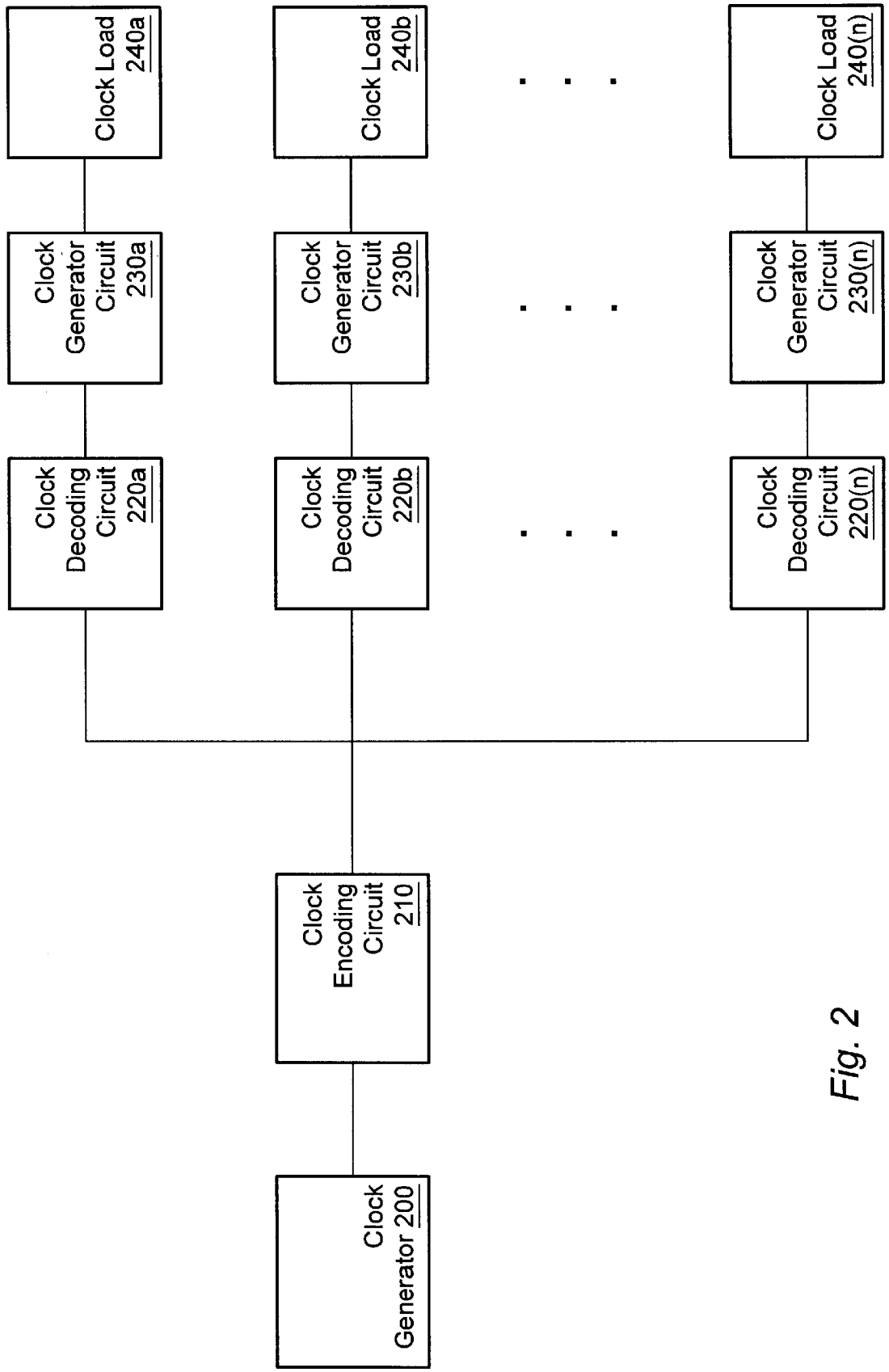
FIG. 2 a block diagram illustrating one embodiment of an encoded clock distribution system.

Turning now to FIG. 2, a block diagram illustrating one embodiment of an encoded clock distribution system is shown. Other embodiments are possible and contemplated. FIG. 2 depicts clock generator 200 coupled to clock encoding circuit 210. Clock encoding circuit 210 is coupled to clock decoding circuits 220a–220(n). Clock decoding circuits 220a–220(n) are coupled to clock generator circuits 230a–230(n) which are, in turn, coupled to clock loads 240a–240(n). Clock decoding circuits 220a–220(n), clock generator circuits 230a–230(n), and clock loads 240a–240(n) will be referred to collectively as clock decoding circuits 220, clock generator circuits 230, and clock loads 240, respectively. Clock decoding circuits 220a–220(n), clock generator circuits 230a–230(n), and clock loads 240a–240(n) will be referred to individually as clock decoding circuit 220, clock generator circuit 230, and clock load 240, respectively. The system of FIG. 2 can be configured to include any number of clock decoding circuits 220, clock generator circuits 230, and clock loads 240. In one embodiment, a clock decoding circuit 220, a clock generator circuit 230, and a clock load 240 can be included in each device in a system such as bus devices 140 in FIG. 1.

FIG. 2 illustrates one embodiment of an encoded clock system. In FIG. 2, clock generator 200 can be configured to generate a source clock signal and can convey the source clock signal to clock encoding circuit 210. Clock encoding circuit 210 can be configured to receive the source clock signal and generate an encoded system clock signal. The encoded system clock signal can then be conveyed to clock decoding circuits 220. Clock decoding circuits 220 can be configured to receive and decode the encoded system clock signal. In one embodiment, clock decoding circuits 220 can be configured to decode the encoded system clock signal into a core clock signal and a phase signal and convey the core clock signal and the phase signal to clock generator circuit 230. In this embodiment, clock generator circuit 230 can be configured to generate a global.clock signal using the core clock signal and the phase signal. Clock generator circuit 230 can also be configured to generate a system clock signal using the encoded system clock signal. Clock generator circuit 230 can be configured to convey the system clock signal and the global clock signal to clock load 240.

Figure 3:
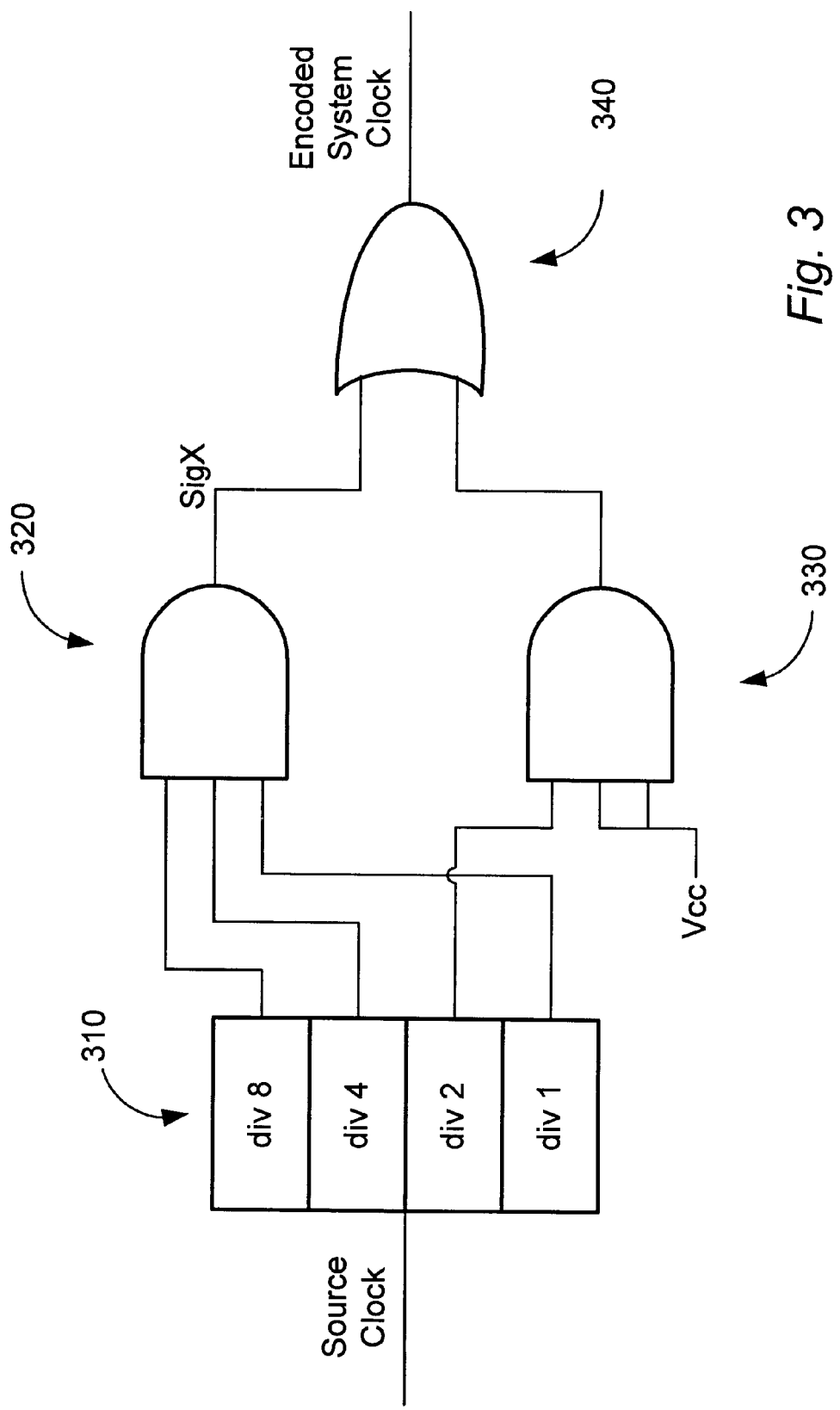
FIG. 3 is a block diagram illustrating one embodiment a clock encoding circuit.

Turning now to FIG. 3, a block diagram illustrating one embodiment a clock encoding circuit is shown. Other embodiments are possible and contemplated. In FIG. 3, the system clock rate is four times the global clock rate. FIG. 3 depicts a frequency division circuit 310 coupled to AND gate 320 and AND gate 330. AND gate 320 and AND gate 330 are coupled to OR gate 340. The embodiment shown in FIG. 3 can be incorporated into clock encoding circuit 210 shown in FIG. 2.

In FIG. 3, a source clock signal can be received in frequency division circuit 310. Frequency division circuit 310 can be configured to generate signals that correspond to the source clock frequency divided by certain integers. As indicated, frequency division circuit 310 can generate a source clock frequency divided by eight signal (div 8), a source clock frequency divided by four signal (div 4), a source clock frequency divided by two signal (div 2), and a source clock frequency divided by one signal (div 1). Although the div 1 signal may match the source clock signal, frequency division circuit 310 may generate the div 1 signal for synchronization purposes with the div 8, div 4, and div 2 signals.

As indicated, the div 8, div 4, and div 1 signals generated by frequency division circuit 310 can be conveyed to AND gate 320. AND gate 320 can perform a logical AND function on the div 8, div 4, and div 1 signals to generate the SigX signal. The SigX signal can be conveyed from AND gate 320 to OR gate 340. Similarly, frequency division circuit 310 can convey the div 2 signal to AND gate 330. The remaining inputs to AND gate 330 can be connected to Vcc, i.e. tied to a positive voltage to generate a logical one. The output of AND gate 330 can be conveyed to OR gate 340. OR gate 340 can be configured to perform a logical OR function on the outputs of AND gates 320 and 330. In this manner, an encoded system clock can be generated as the output of OR gate 340.

Figure 4:
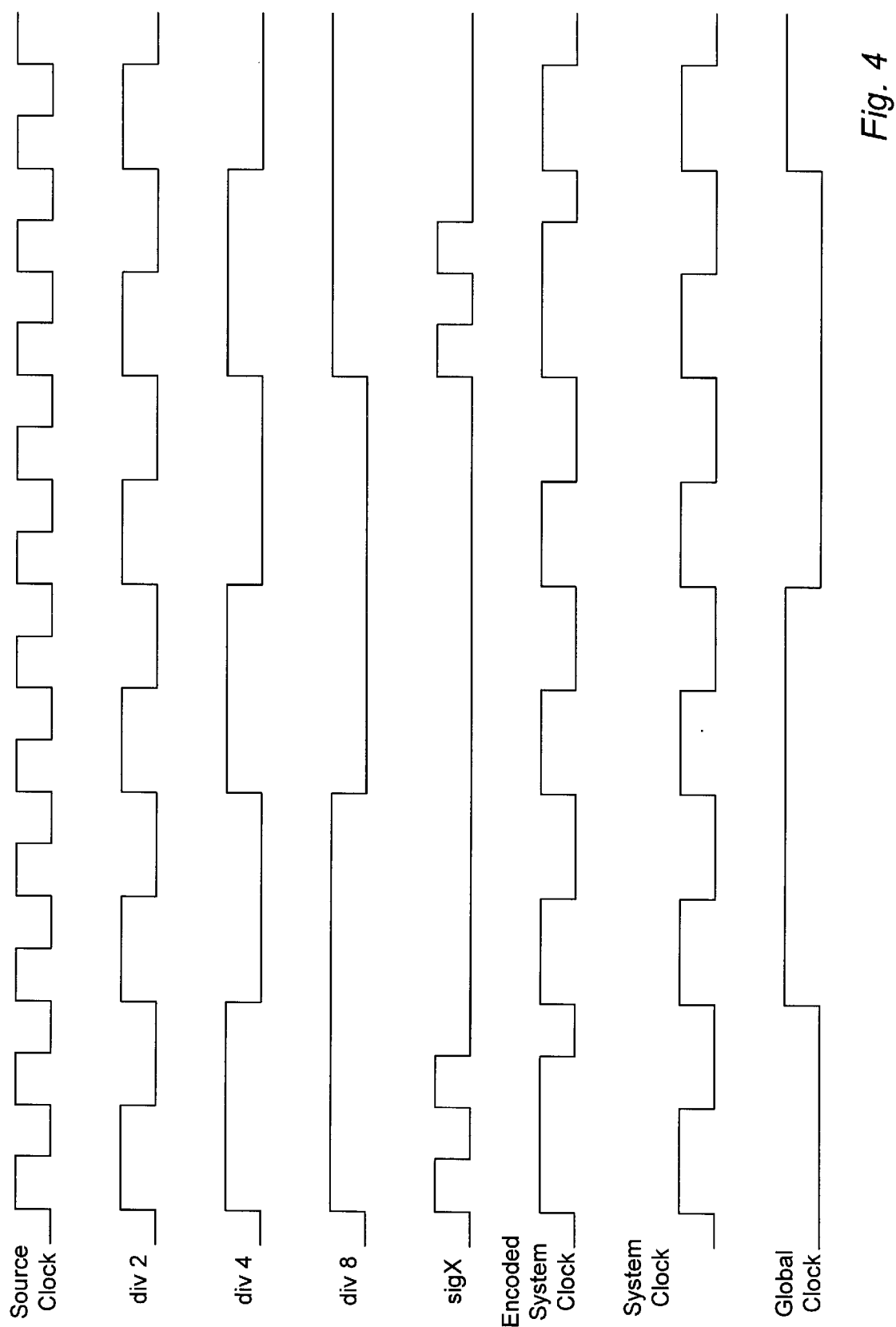
FIG. 4 is a timing diagram illustrating a set of signals corresponding to the embodiment of FIG. 3.

Turning now to FIG. 4, a timing diagram illustrating a set of signals corresponding to the embodiment of FIG. 3 is shown. The signals depicted in FIG. 4 include the source clock signal, the div 2 signal, the div 4 signal, the div 8 signal, the SigX signal, the encoded system clock, the system clock, and the global clock. Although not shown, the div 1 signal can match the source clock signal in FIG. 4. In FIG. 4, the div 2, div 4, and div 8 signals are shown phase aligned with the source clock signal for illustrative purposes. It can be noted that the div 2, div 4, and div 8 signals as well as the div 1 signal may be phase shifted from the source clock signal due to timing delays from frequency division circuit 310.

As can be seen in FIG. 4, the encoded system clock signal has a 75% high duty cycle on every fourth pulse with a nominal 50% high duty cycle on the remaining pulses. The system clock signal, by comparison, has a 50% high duty cycle on each pulse. In the embodiment of FIG. 3, the global clock rate is one fourth of the system clock rate and the first pulse following the 75% high duty cycle on the encoded system clock can be defined as synchronous with the global clock signal. Hence, the global clock signal is shown phase aligned with the first pulse of the encoded system clock following the 75% high duty cycle pulse. Other embodiments can define the global clock signal as synchronous with other pulses relative to the 75% high duty cycle pulse.

Figure 5:
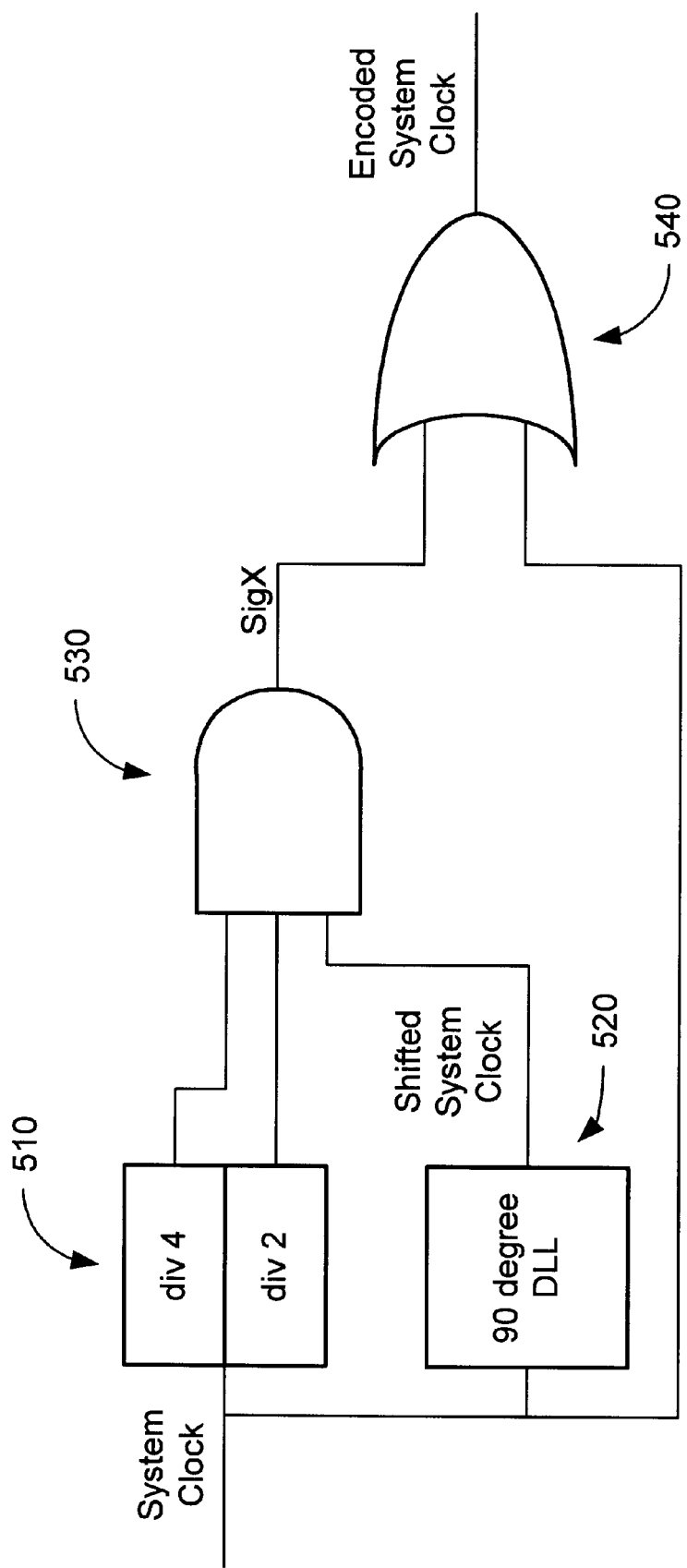
FIG. 5 is a block diagram illustrating one embodiment a clock encoding circuit.

Turning now to FIG. 5, a block diagram illustrating one embodiment a clock encoding circuit is shown. Other embodiments are possible and contemplated. FIG. 5 depicts a frequency division circuit 510 and a 90 degree phase shifting DLL (delay locked loop) 520 coupled to AND gate 530. AND gate 530 is coupled to OR gate 540. The embodiment shown in FIG. 5 can be incorporated into clock encoding circuit 210 shown in FIG. 2.

In FIG. 5, a system clock signal can be received in frequency division circuit 510, 90 degree phase shifting DLL 520, and OR gate 540. Frequency division circuit 510 can be configured to generate signals that correspond to the source clock frequency divided by certain integers. As indicated, frequency division circuit 510 can generate a source clock frequency divided by four signal (div 4) and a source clock frequency divided by two signal (div 2). 90 degree phase shifting DLL 520 can be configured.to phase shift the system clock signal 90 degree to generate a shifted system clock signal.

As indicated, the div 4 and div 2 signals generated by frequency division circuit 510 and the shifted system clock signal generated by 90 degree phase shifting DLL 520 can be conveyed to AND gate 530. AND gate 530 can perform a logical AND function on the div 4, div 2, and shifted system clock signals to generate the SigX signal. The SigX signal can be conveyed from AND gate 530 to OR gate 540. OR gate 540 can be configured to perform a logical OR function on the SigX and system clock signals. In this manner, an encoded system clock can be generated as the output of OR gate 540 for a 4:1 clock rate ratio of the system clock and the global clock.

Figure 6:
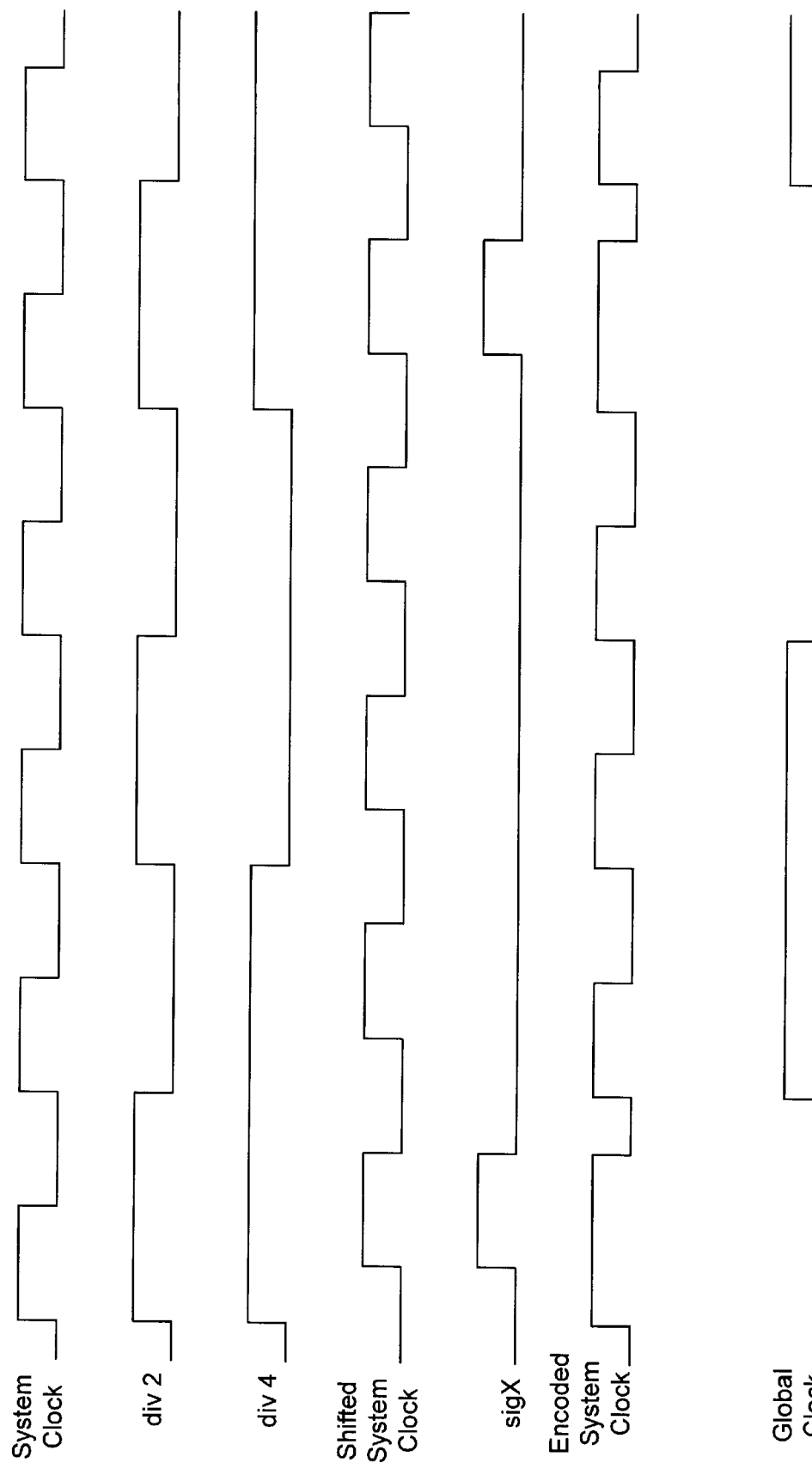
FIG. 6 is a timing diagram illustrating a set of signals corresponding to the embodiment of FIG. 5.

Turning now to FIG. 6, a timing diagram illustrating a set of signals corresponding to the embodiment of FIG. 5 is shown. The signals depicted in FIG. 6 include the system clock signal, the div 2 signal, the div 4 signal, the shifted system clock signal, the SigX signal, the encoded system clock, and the global clock. In FIG. 6, all signals are shown phase aligned with the system clock signal for illustrative purposes. It can be noted that the signals may be phase shifted from the system clock signal due to timing delays from frequency division circuit 510, 90 degree phase shifted DLL 520, AND gate 530, and OR gate 540.

As can be seen in FIG. 6, the encoded system clock signal has a 75% high duty cycle on every fourth pulse with a nominal 50% high duty cycle on the remaining pulses. The system clock signal, by comparison, has a 50% high duty cycle on each pulse. In the embodiment of FIG. 5, the global clock rate is one fourth the system clock rate and the first pulse following the 75% high duty cycle on the encoded system clock can be defined as synchronous with the global clock signal. Hence, the global clock signal is shown phase aligned with the first pulse of the encoded system clock following the 75% high duty cycle pulse. Other embodiments can define the global clock signal as synchronous with other pulses relative to the 75% high duty cycle pulse.

Figure 7:
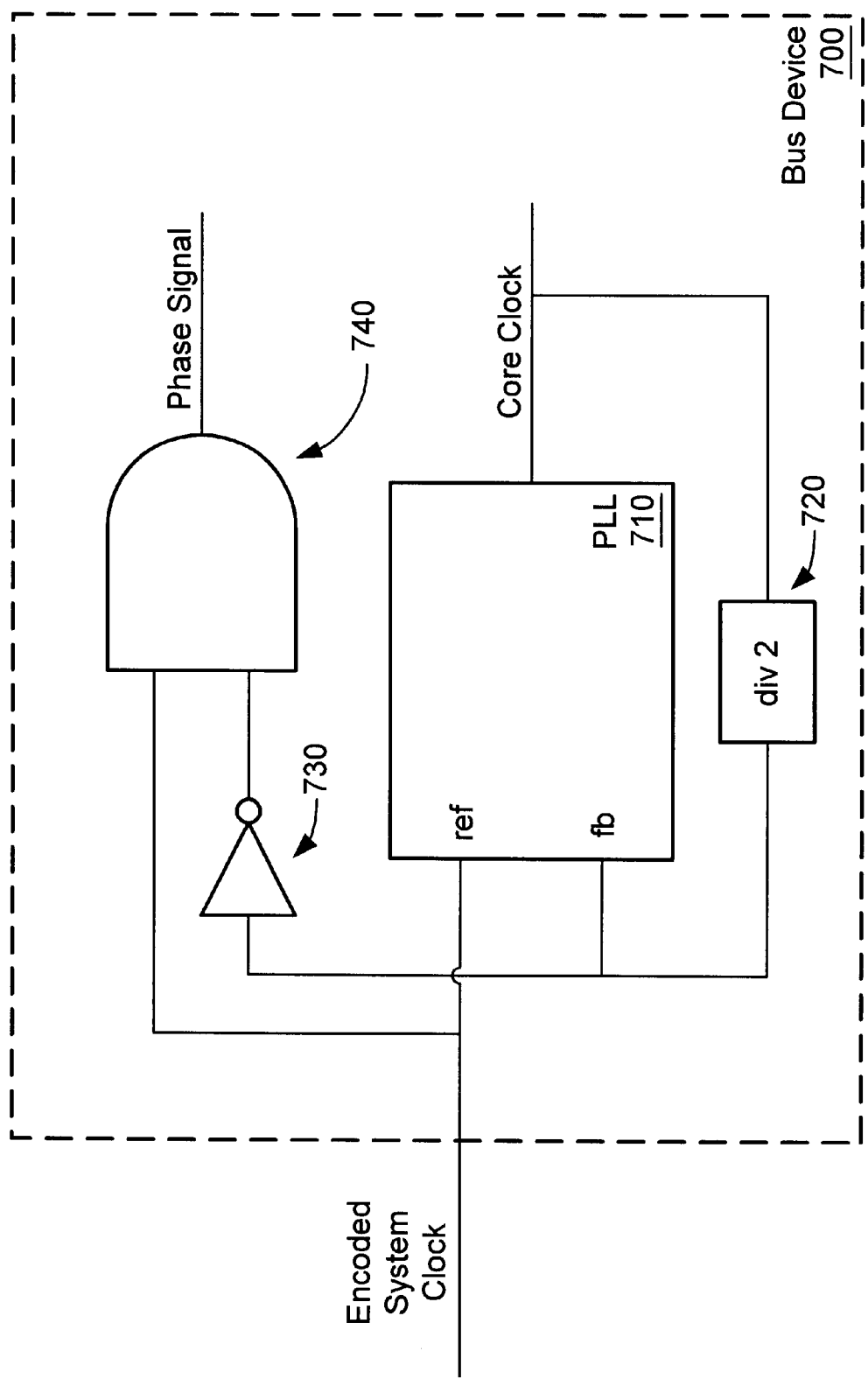
FIG. 7 is a block diagram illustrating one embodiment a clock decoding circuit.

Turning now to FIG. 7, a block diagram illustrating one embodiment a clock decoding circuit is shown. Other embodiments are possible and contemplated. FIG. 7 depicts bus device 700 that includes PLL (phase locked loop) 710 coupled to frequency division circuit 720, inverter 730, and AND gate 740. The embodiment shown in FIG. 7 can be incorporated into clock decoding circuit 220 shown in FIG. 2.

In FIG. 7, bus device 700 can be configured to receive an encoded system clock signal such as one of the encoded system clock signals generated by the embodiment of FIG. 3 or FIG. 5. The encoded system clock signal can be conveyed to the reference (ref) input of PLL 710. PLL 710 can be configured to output a core clock signal. The core clock signal can be conveyed to frequency division circuit 720. Frequency division circuit 720 can be configured to output a feedback clock signal, i.e. the core clock signal frequency divided by two, and can convey the feedback clock signal to the feedback (fb) input of PLL 710. PLL 710 can employ a rising edge phase detector and can comprise any suitable phase locked loop.

The feedback clock signal can also be conveyed to inverter 730. Inverter 730 can be configured to invert the feedback clock signal into an inverted feedback clock signal and can convey the inverted feedback clock signal to AND gate 740. AND gate 740 can be configured to receive the encoded system clock signal and perform a logical AND function on the encoded system clock signal and the inverted feedback clock signal to generate the phase signal.

Figure 8A:
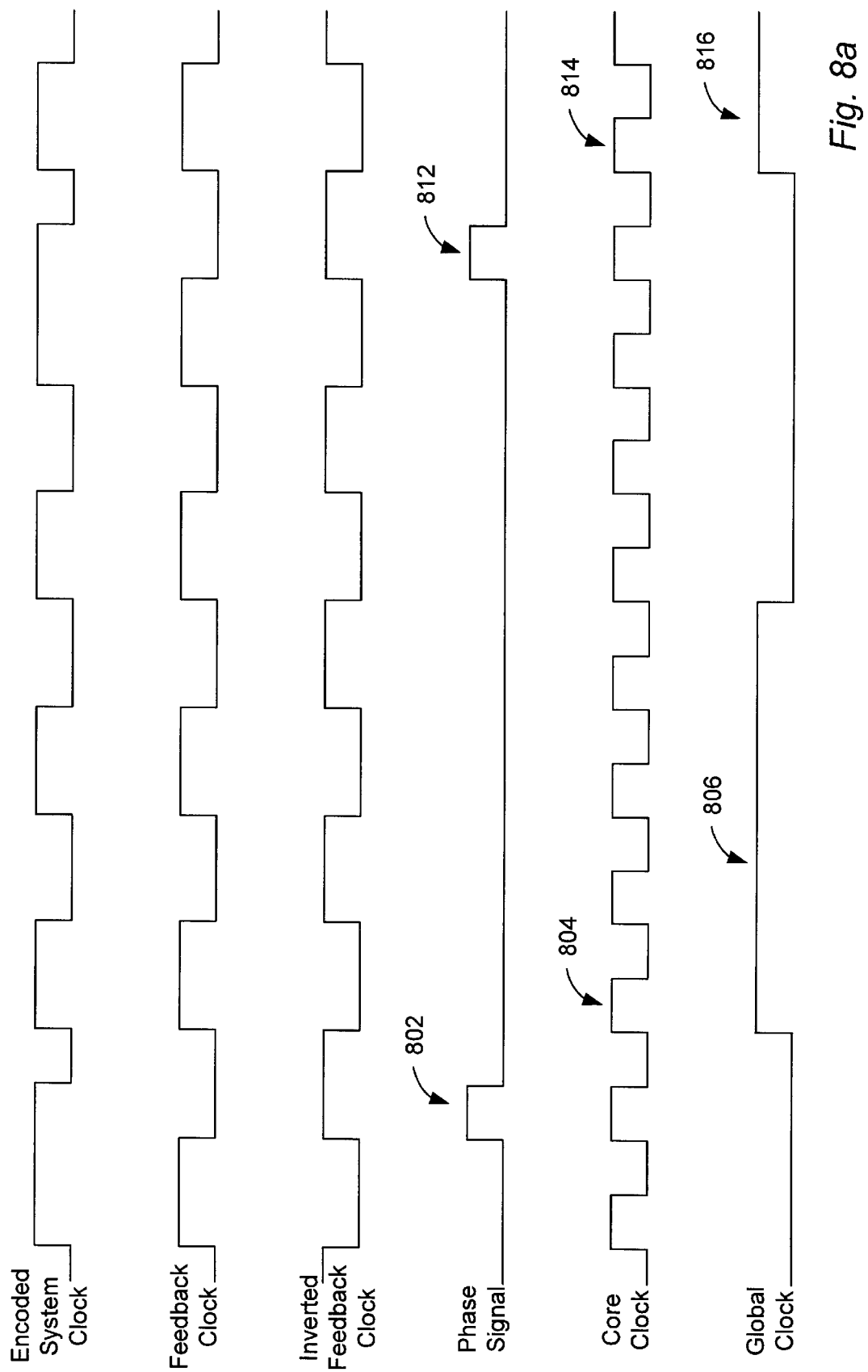
FIG. 8a is a timing diagram illustrating a set of signals corresponding to the embodiment of FIG. 7.

Turning now to FIG. 8a, a timing diagram illustrating a set of signals corresponding to the embodiment of FIG. 7 is shown. The signals depicted in FIG. 8a include the encoded system clock signal, the feedback clock signal, the inverted feedback clock signal, the phase signal, the core clock signal, and the global clock signal. In FIG. 8a, all signals are shown phase aligned with the encoded system clock signal for illustrative purposes. It can be noted that the signals may be phase shifted from the encoded system clock signal due to timing delays from PLL 710, frequency division circuit 720, inverter 730, and AND gate 740.

As can be seen in FIG. 8a, the encoded system clock signal has a 75% high duty cycle on every fourth pulse with a nominal 50% high duty cycle on the remaining pulses. The feedback clock signal and inverted feedback clock signal have a 50% high duty cycle on each pulse. As noted in the embodiments of FIG. 3 and FIG. 5 for a 4:1 system clock to global clock rate ratio, the first pulse following the 75% high duty cycle on the encoded system clock can be defined as synchronous with the global clock signal. Hence, the global clock signal is shown phase aligned with the first pulse of the encoded system clock following the 75% high duty cycle pulse. Other embodiments can define the global clock signal as synchronous with other pulses relative to the 75% high duty cycle pulse.

It can be noted that the pulses of the phase signal, pulses 802 and 812, generated by the embodiment of FIG. 7 correspond to the 75% high duty cycle of the encoded system clock. Pulses 802 and 812 can be used with the core clock signal to generate the global clock signal. For example, where the global clock signal is defined as synchronous with the first pulse following the 75% high duty cycle on the encoded system clock, pulses 806 and 816 of the global clock signal can be generated to be synchronous with core clock pulses 804 and 814, i.e. the core clock pulses following phase signal pulses 802 and 812. The phase signal and core clock signal could also be used to generate the system clock for bus device 700. Thus, the phase signal and the core clock could be conveyed to a clock generator circuit such as clock generator circuit 230 of FIG. 2 to generate a system clock and a global clock.

Figure 8B:
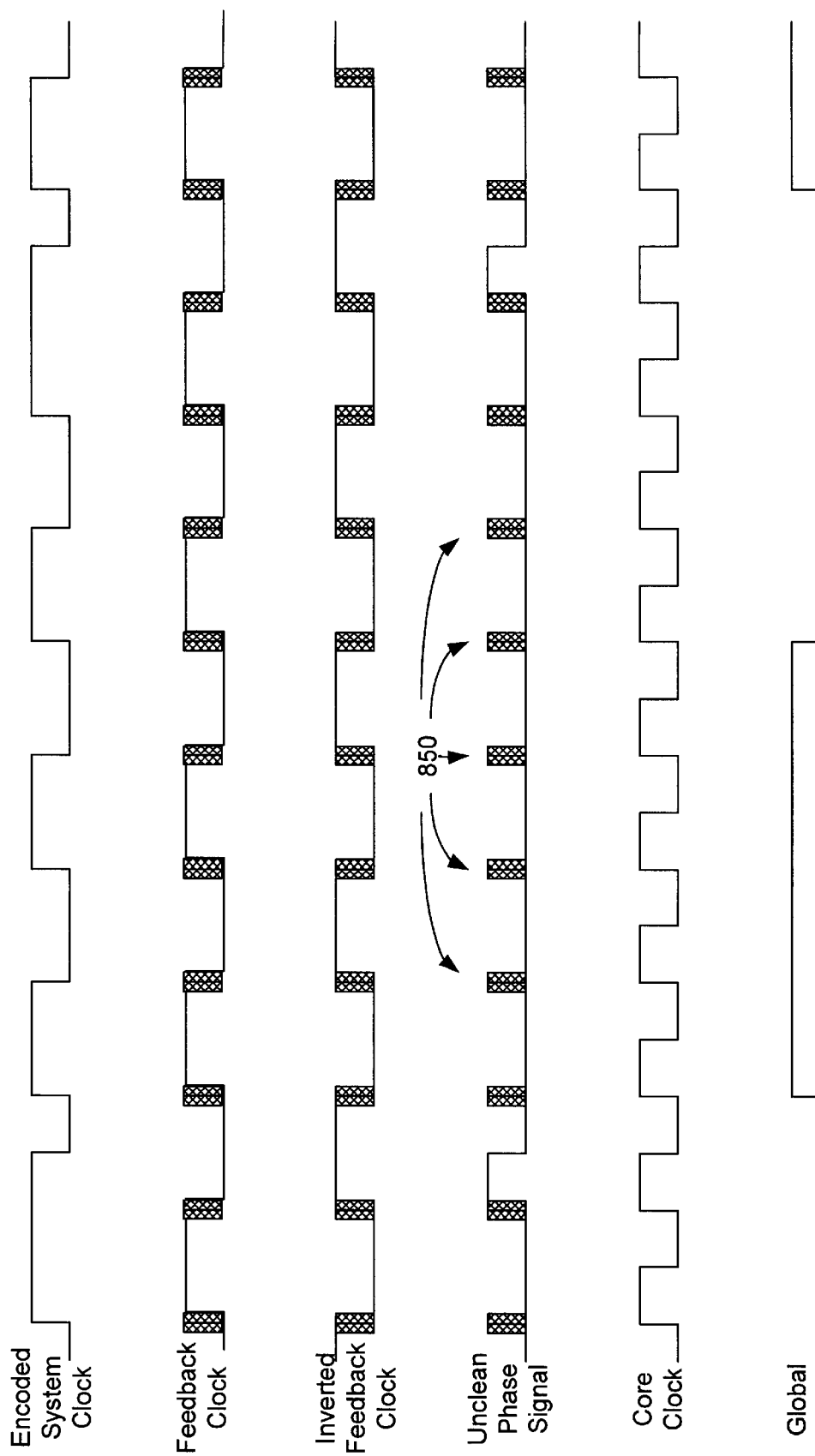
FIG. 8b is a timing diagram illustrating a set of signals corresponding to the embodiment of FIG. 7.

Turning now to FIG. 8b, a timing diagram illustrating a set of signals corresponding to the embodiment of FIG. 7 is shown. FIG. 8b illustrates a difficulty that may occur in certain configurations of the embodiment of FIG. 7. The signals depicted in FIG. 8b include the encoded system clock signal, the feedback clock signal, the inverted feedback clock signal, the unclean phase signal, the core clock signal, and the global clock signal. In FIG. 8b, all signals are shown phase aligned with the encoded system clock signal for illustrative purposes. It can be noted that the signals may be phase shifted from the encoded system clock signal due to timing delays from PLL 710, frequency division circuit 720, inverter 730, and AND gate 740.

The shaded regions of FIG. 8b are intended to indicate time periods where the respective signals could transition.

This is due to positive or negative phase error in PLL 710 and delay matching errors of signal routing. The periods where the feedback clock and inverted feedback clock signals correspond to a transitory state can result in undesirable pulse spikes 850 on the unclean phase signal. In certain embodiments, the pulse spikes 850 may prevent proper generation of the system clock and global clock signals. The embodiments of FIG. 9 and FIG. 11 discussed below may be used to prevent the pulse spikes.

Figure 9:
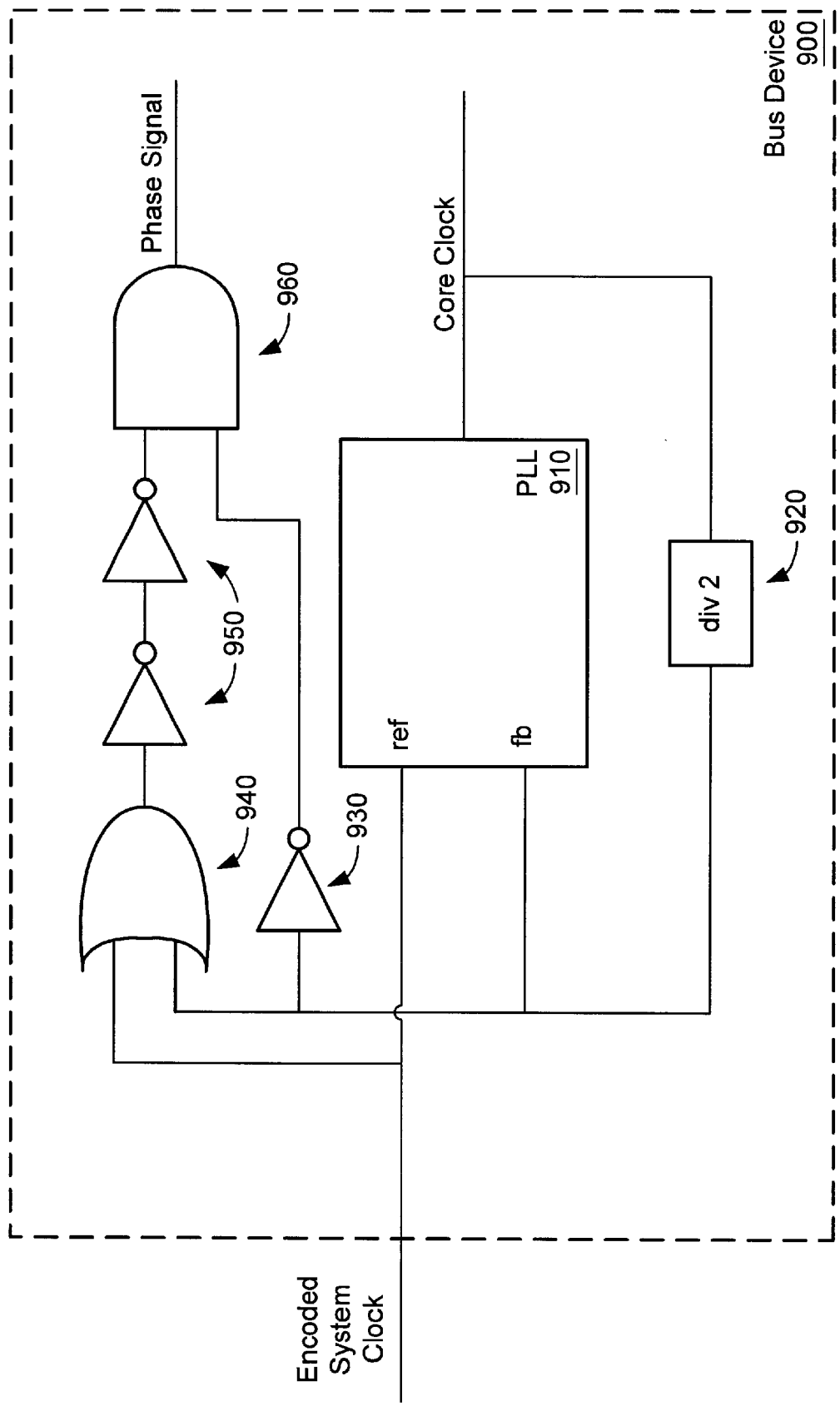
FIG. 9 is a block diagram illustrating one embodiment a clock decoding circuit.

Turning now to FIG. 9, a block diagram illustrating one embodiment a clock decoding circuit is shown. Other embodiments are possible and contemplated. FIG. 9 depicts bus device 900 that includes PLL (phase locked loop) 910 coupled to frequency division circuit 920, inverter 930, OR gate 940, inverters 950, and AND gate 960. The embodiment shown in FIG. 9 can be incorporated into clock decoding circuit 220 shown in FIG. 2.

In FIG. 9, bus device 900 can be configured to receive an encoded system clock signal such as one of the encoded system clock signals generated by the embodiment of FIG. 3 or FIG. 5. The encoded system clock signal can be conveyed to the reference (ref) input of PLL 910. PLL 910 can be configured to output a core clock signal. The core clock signal can be conveyed to frequency division circuit 920. Frequency division circuit 920 can be configured to output a feedback clock signal, i.e. the core clock signal frequency divided by two, and can convey the feedback clock signal to the feedback (fb) input of PLL 910. PLL 910 can employ a rising edge phase detector and can comprise any suitable phase locked loop.

The feedback clock signal can also be conveyed to inverter 930. Inverter 930 can be configured to invert the feedback clock signal into an inverted feedback clock signal and can convey the inverted feedback clock signal to AND gate 960. The feedback clock signal and the encoded system clock signal can be conveyed to OR gate 940. OR gate 940 can be configured to perform logical OR function on the feedback clock signal and the encoded system clock signal and can be configured to convey the output of the function to inverters 950. Inverters 950 can be used for timing purposes and may be omitted in certain embodiments. The output signal of inverters 950 can be conveyed to AND gate 960. AND gate 960 can be configured to receive the output signal from inverters 950 and perform a logical AND function on the output signal from inverters 950 and the inverted feedback clock signal to generate the phase signal.

Figure 10:
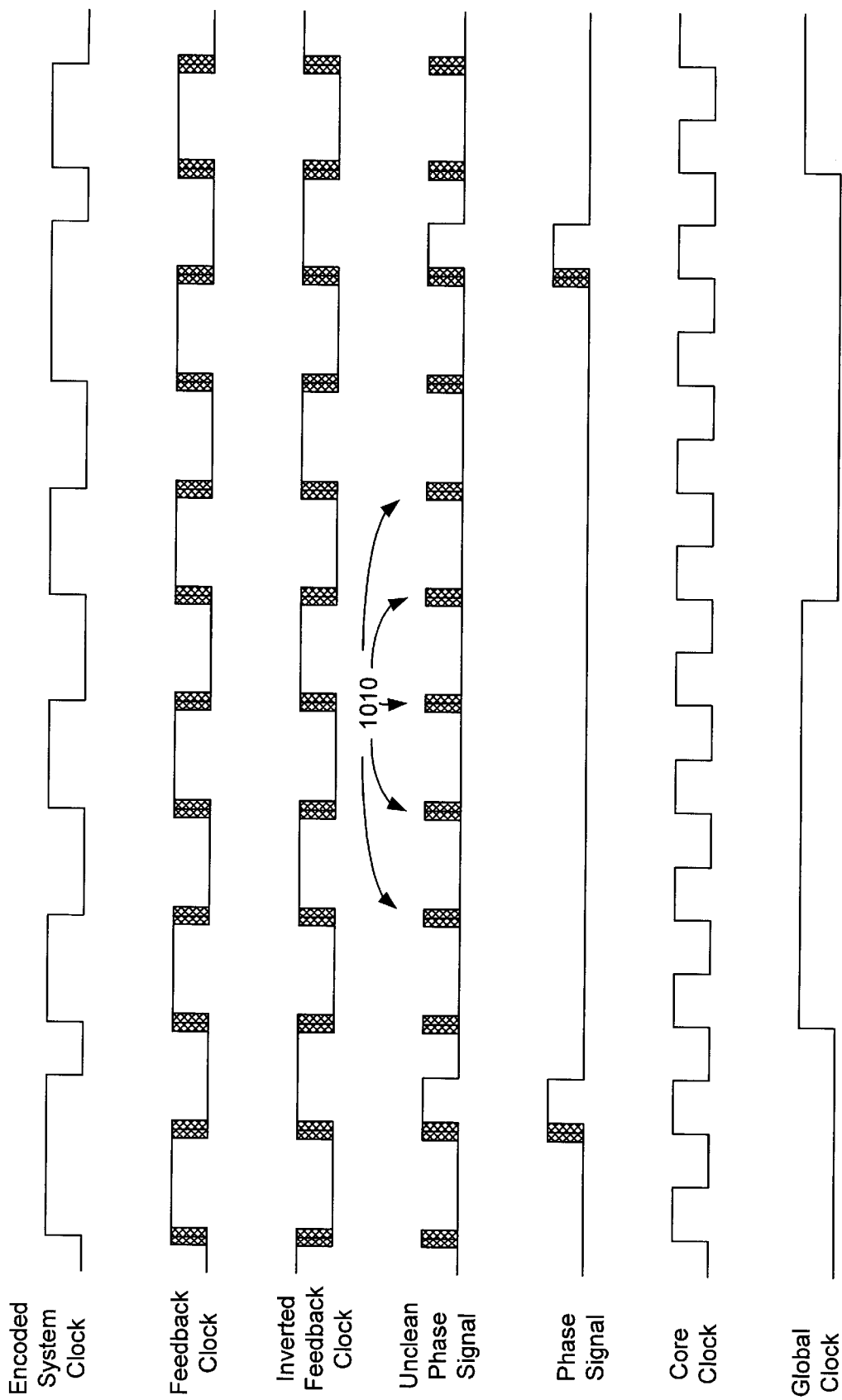
FIG. 10 is a timing diagram illustrating a set of signals corresponding to the embodiment of FIG. 9.

Turning now to FIG. 10, a timing diagram illustrating a set of signals corresponding to the embodiment of FIG. 9 is shown. The signals depicted in FIG. 10 include the encoded system clock signal, the feedback clock signal, the inverted feedback clock signal, the unclean phase signal, the phase signal, the core clock signal, and the global clock signal. In FIG. 10, all signals are shown phase aligned with the encoded system clock signal for illustrative purposes. It can be noted that the signals may be phase shifted from the encoded system clock signal due to timing delays from PLL 910, frequency division circuit 920, inverter 930, OR gate 940, inverters 950, and AND gate 960.

The shaded regions of FIG. 10 are intended to indicate time periods where the respective signals could be in either the low state or the high state of the respective pulses. As noted above, the periods shown where the feedback clock and inverted feedback clock signals correspond to a transitory state can result in undesirable pulse spikes 1010 as indicated by the unclean phase signal. The circuit of FIG. 9, however, may prevent pulse spikes 1010 from occurring on the pulse signal as shown. As a result, the phase signal and core clock signal can be used to generate system clock and a global clock as described above with respect to FIG. 8a.

Figure 11:
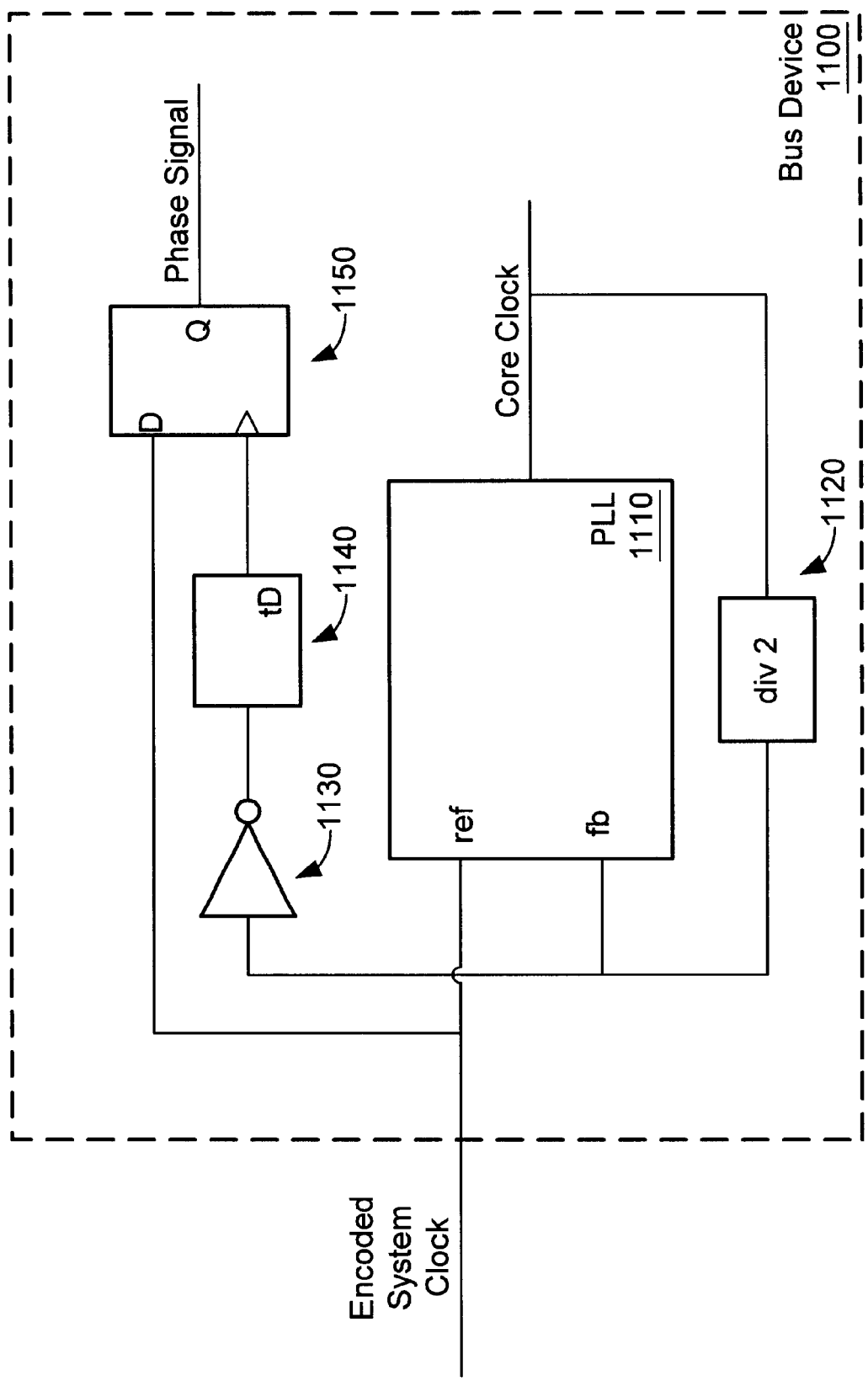
FIG. 11 is a block diagram illustrating one embodiment a clock decoding circuit.

Turning now to FIG. 11, a block diagram illustrating one embodiment a clock decoding circuit is shown. Other embodiments are possible and contemplated. FIG. 11 depicts bus device 1100 that includes PLL (phase locked loop) 1110 coupled to frequency division circuit 1120, inverter 1130, time delay circuit 1140, and clocked D flip-flop 1150. The embodiment shown in FIG. 11 can be incorporated into clock decoding circuit 220 shown in FIG. 2.

In FIG. 11, bus device 1100 can be configured to receive an encoded system clock signal such as one of the encoded system clock signals generated by the embodiment of FIG. 3 or FIG. 5. The encoded system clock signal can be conveyed to the reference (ref) input of PLL 1110. PLL 1110 can be configured to output a core clock signal. The core clock signal can be conveyed to frequency division circuit 1120. Frequency division circuit 1120 can be configured to output a feedback clock signal, i.e. the core clock signal frequency divided by two, and can convey the feedback clock signal to the feedback (fb) input of PLL 1110. PLL 1110 can employ a rising edge phase detector and can comprise any suitable phase locked loop.

The feedback clock signal can also be conveyed to inverter 1130. Inverter 1130 can be configured to invert the feedback clock signal into an inverted feedback clock signal and can convey the inverted feedback clock signal to time delay circuit 1140. Time delay circuit 1140 can be configured to delay the inverted feedback clock signal. In one embodiment, time delay circuit 1140 can be configured to delay the inverted feedback clock signal by a time greater than the reference signal to feedback signal clock skew. In other embodiments, time delay circuit 1140 can be configured to delay the inverted feedback clock signal by other time amounts. Time delay circuit 1140 can be configured to convey the inverted feedback clock signal to the clock input of clocked D flip-flop 1150. Clocked D flip-flop 1150 can be configured to receive the encoded system clock signal as its D input and generate the phase signal.

Figure 12:
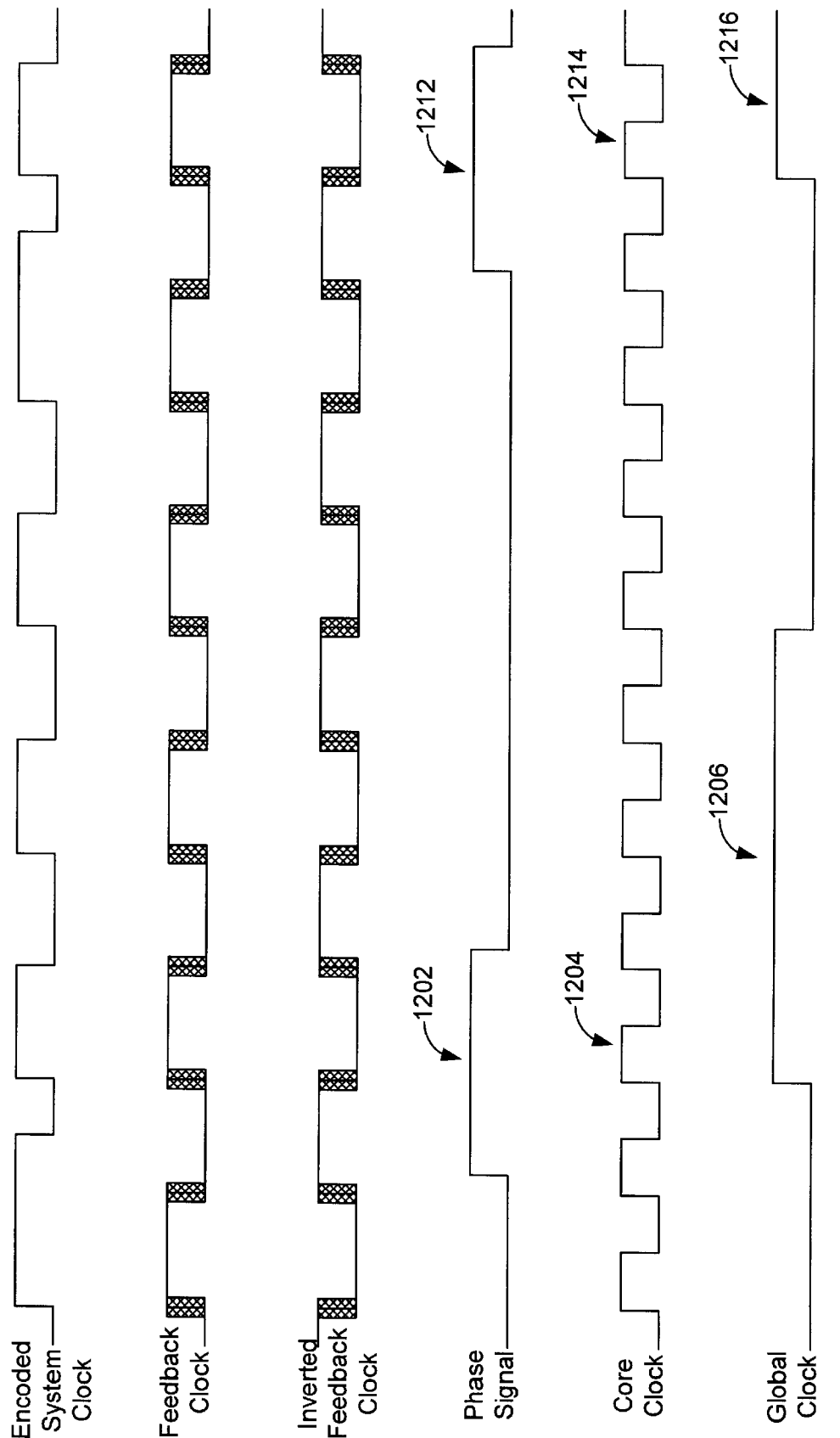
FIG. 12 is a timing diagram illustrating a set of signals corresponding to the embodiment of FIG. 11.

Turning now to FIG. 12, a timing diagram illustrating a set of signals corresponding to the embodiment of FIG. 11 is shown. The signals depicted in FIG. 12 include the encoded system clock signal, the feedback clock signal, the inverted feedback clock signal, the phase signal, the core clock signal, and the global clock signal. In FIG. 12, all signals are shown phase aligned with the encoded system clock signal for illustrative purposes. It can be noted that the signals may be phase shifted from the encoded system clock signal due to timing delays from PLL 1110, frequency division circuit 1120, inverter 1130, time delay circuit 1140, and clocked D flip-flop 1150.

The shaded regions of FIG. 12 are intended to indicate time periods where the respective signals could be in either the low state or the high state of the respective pulses. The embodiment of FIG. 11 may avoid the undesirable pulse spikes described above in FIG. 8b and FIG. 10. As a result, the phase signal and core clock signal can be used to generate a system clock and a global clock as described above with respect to FIG. 8a. In one embodiment, a core clock pulse following a phase signal pulse can be defined as synchronous with the global clock signal. In FIG. 12, global clock pulses 1206 and 1216 are shown synchronized with core clock pulses 1204 and 1214, respectively, as core clock pulses 1204 and 1214 follow phase signal pulses 1202 and 1212, respectively. In other embodiments, the global clock signal can be defined as synchronous with other core clock pulses.

Figure 13:
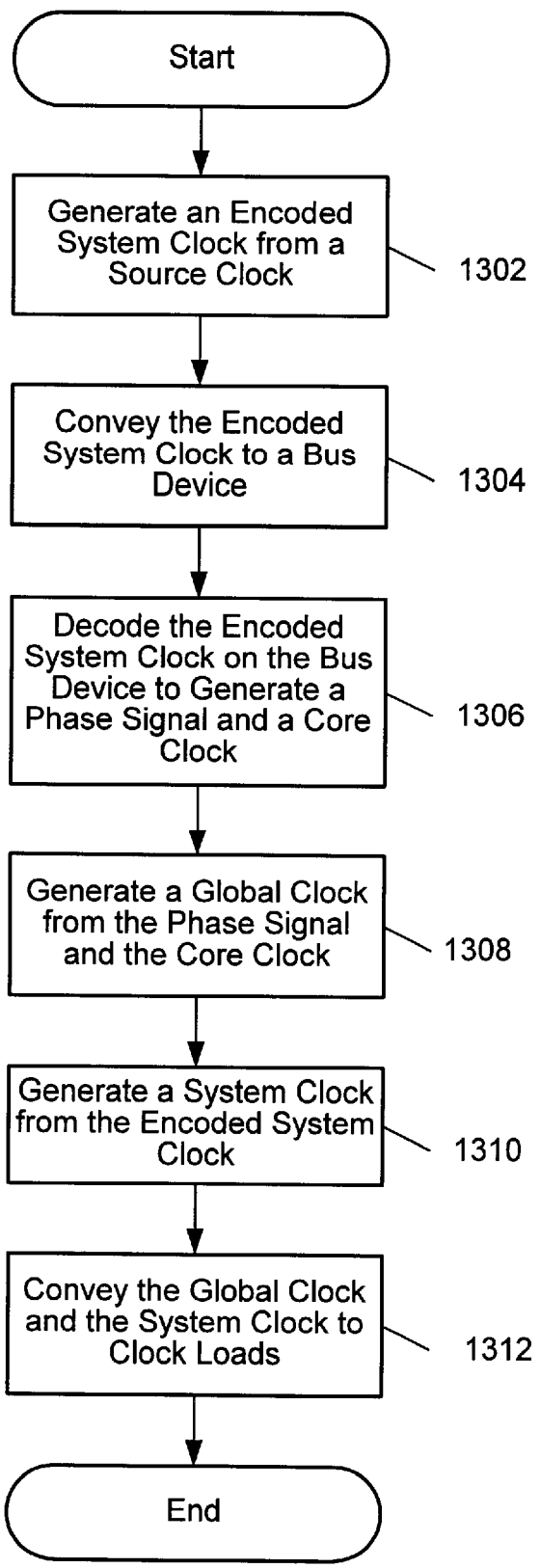
FIG. 13 is a chart illustrating a method for encoding and decoding a clock in a computer system.

Turning now to FIG. 13, a chart illustrating a method for encoding and decoding a clock in a computer system is shown. Variations of the method are possible and contemplated. In FIG. 13, an encoded system clock can be generated from a source clock as indicated in block 1302. The encoded system clock can be conveyed to a bus device as indicated in block 1304. The encoded system clock can be decoded on the bus device to generate a phase signal and a core clock as indicated in block 1306. A global clock can be generated from the phase signal and core clock as indicated in block 1308. A system clock can be generated from the encoded system clock as indicated in block 1310. The global clock and the system clock can be conveyed to clock loads as indicated in block 1312. The portions of the method illustrated in blocks 1306, 1308, 1310, and 1312 could happen in bus devices, processors, and/or memory controllers.

Figure 14:
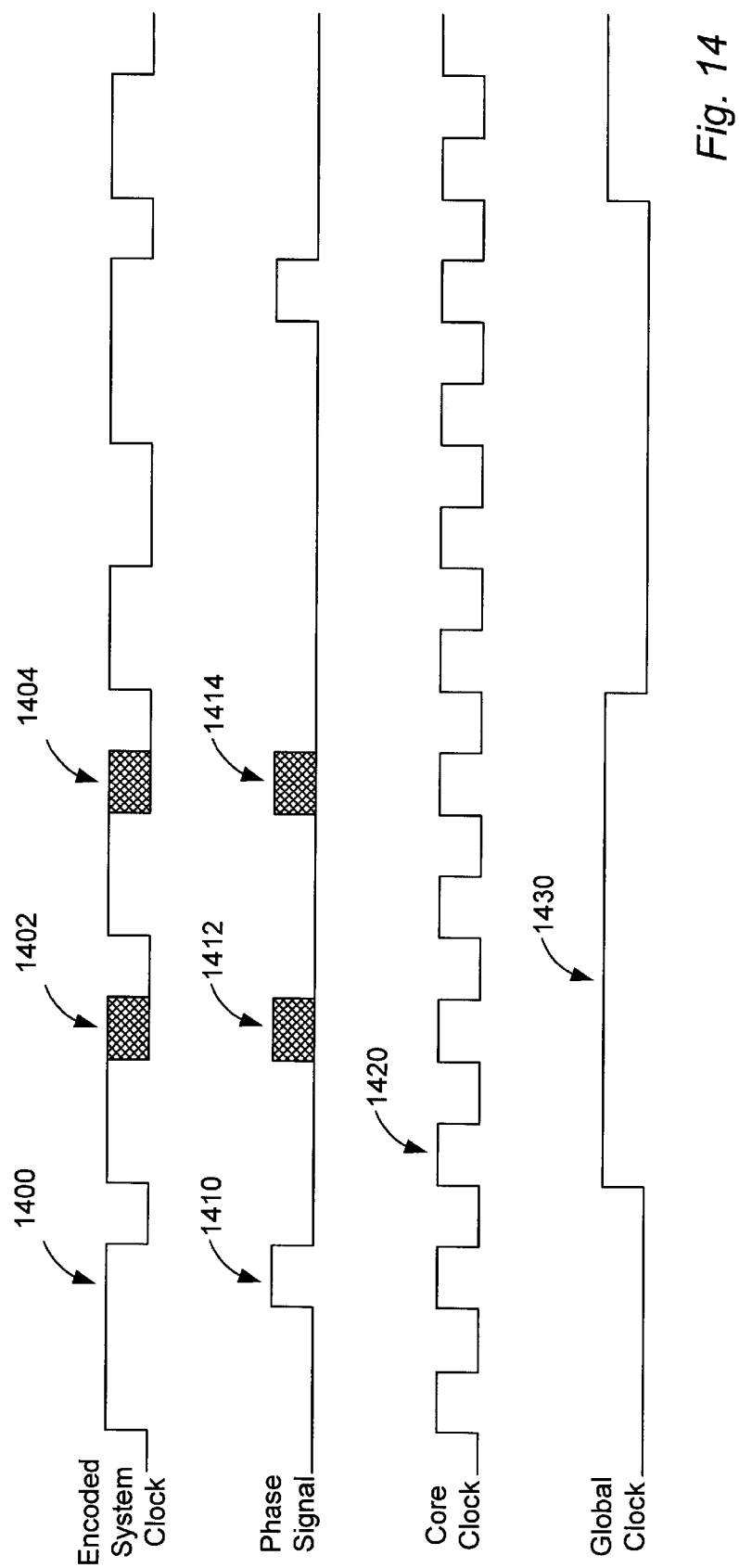
FIG. 14 is a timing diagram illustrating a signal configured to encode a clock phase and other information.

Turning now to FIG. 14, a timing diagram illustrating a signal configured to encode a clock phase and other information is shown. FIG. 14 depicts an encoded system clock signal, a phase signal, a core clock signal, and a global clock signal.

As noted above, a global clock signal can be generated synchronously with a pulse of the core clock signal that follows a pulse of the phase signal in one embodiment. In FIG. 14, for example, global clock pulse 1430 is shown as being synchronous with core clock pulse 1420. Core clock pulse 1420 follows phase pulse 1410 where phase pulse 1410 corresponds to encoded system clock pulse 1400. In FIG. 14, every fourth pulse of the encoded system clock is stretched to a 75% high duty cycle. In other embodiments, other i'th pulses of the encoded system clock can be stretched or shortened, where i is an integer greater than 1, and a corresponding phase signal can be generated for the stretched or shortened pulses.

As indicated in FIG. 14, the encoded system clock can include other encoded information in addition to encoding information that can be used to generate a global clock. As noted above, pulses such as encoded system clock pulse 1400, phase pulse 1410, and core clock pulse 1420 can be used to generate a global clock signal. Other information, such as state information, can be encoded by stretching or shortening other pulses on the encoded system clock. For example, pulses 1402 and 1404 can be stretched to 75% high duty cycles, as indicated by the shaded regions. Pulses 1402 and 1404 can result in phase signal pulses 1412 and 1414, respectively, and these phase signal pulses can be used, either alone or in conjunction with the core clock signal, to convey additional information to the bus devices that receive the encoded clock signal. The additional information could include such information as a global reset signal or an identifier for enabling a lower power EnergyStar mode. The encoded system clock could include stretched or shortened high pulses in any manner that would still allow the global clock to be generated as phase aligned with the system clock. Alternatively, the encoded clock could contain encoded information that did not include the global clock.

It can be noted that other embodiments may employ a core clock rate other than the core clock rate that is two times the system clock rate described in the above embodiments. Also, frequency division circuit 720 (shown in FIG. 7), frequency division circuit 920 (shown in FIG. 9), or other PLL feedback dividers used in other embodiments can be configured to divide the core clock signal by other even integers. In other embodiments, the phase of the global clock can be set to correspond to other predetermined numbers of core clocks after the phase pulse. Other clock ratios can be selected that enable decoding.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications.

I claim:

1. An apparatus comprising:
    a clock encoding circuit configured to receive a source clock signal, wherein said clock encoding circuit is configured to generate an encoded system clock signal using said source clock signal;
    a clock decoding circuit configured to receive said encoded system clock signal, wherein said clock decoding circuit is configured to generate a phase signal and a core clock signal using said encoded source clock signal; and
    a clock generating circuit configured to generate a global clock signal using said phase signal and said core clock signal, and wherein said clock generating circuit is configured to generate a system clock signal that is synchronous with said global clock signal using said encoded clock signal.

2. The apparatus of claim 1, wherein said encoded system clock includes a first plurality of pulses and a second plurality of pulses, and wherein said first plurality of pulses correspond to a different duty cycle than said second plurality of pulses.

3. The apparatus of claim 2, wherein said first plurality of pulses correspond to a longer duty cycle than said second plurality of pulses.

4. The apparatus of claim 2, wherein said first plurality of pulses correspond to a shorter duty cycle than said second plurality of pulses.

5. The apparatus of claim 2, wherein each of said first plurality of pulses occurs at a regular interval of said encoded system clock.

6. The apparatus of claim 2, wherein each of said first plurality of pulses is followed by an integer number of said second plurality of pulses, and wherein said integer number is greater than one.

7. The apparatus of claim 2, wherein said encoded system clock includes a third plurality of pulses, wherein said third plurality of pulses correspond to a same duty cycle as said first plurality of pulses, and wherein said third plurality of pulses include encoded information.

8. The apparatus of claim 2, wherein said pulse signal includes a third plurality of pulses, wherein said third plurality of pulses correspond to said first plurality of pulses.

9. A method comprising:
    generating an encoded clock signal using a source clock signal;
    generating a pulse signal and a core clock signal using said encoded clock signal;
    generating a global clock signal using said pulse signal and said core clock; and
    generating a system clock signal that is synchronous with said global clock signal using said encoded system clock.

10. The method of claim 9, wherein said generating said encoded clock signal includes:
    generating a first plurality of pulses; and
    generating a second plurality of pulses;
    wherein said first plurality of pulses correspond to a different duty cycle than said second plurality of pulses.

11. The method of claim 10, wherein said first plurality of pulses correspond to a longer duty cycle than said second plurality of pulses.

12. The method of claim 10, wherein said first plurality of pulses correspond to a shorter duty cycle than said second plurality of pulses.

13. The method of claim 10, wherein each of said first plurality of pulses is followed by an integer number of said second plurality of pulses, and wherein said integer number is greater than one.

14. The method of claim 10, wherein said generating said encoded clock signal includes:

generating a third plurality of pulses, wherein said third plurality of pulses correspond to a same duty cycle as said first plurality of pulses, and wherein said third plurality of pulses include encoded information.

15. An apparatus comprising:

a clock encoding circuit configured to receive a source clock signal, and wherein said clock encoding circuit is configured to generate an encoded clock signal using said source clock signal; and a plurality of devices coupled to said clock encoding circuit, wherein each of said plurality of devices includes:

a clock decoding circuit configured to receive said encoded system clock signal, wherein said clock decoding circuit is configured to generate a phase signal and a core clock signal using said encoded source clock signal; and a clock generating circuit configured to generate a global clock signal using said phase signal and said core clock signal, and wherein said clock generating circuit is configured to generate a system clock signal that is synchronous with said global clock signal using said encoded clock signal.

16. The apparatus of claim 15, wherein said encoded system clock includes a first plurality of pulses and a second plurality of pulses, and wherein said first plurality of pulses correspond to a different duty cycle than said second plurality of pulses.

17. The apparatus of claim 16, wherein said first plurality of pulses correspond to a longer duty cycle than said second plurality of pulses.

18. The apparatus of claim 16, wherein said first plurality of pulses .correspond to a shorter duty cycle than said second plurality of pulses.

19. The apparatus of claim 16, wherein each of said first plurality of pulses occurs at a regular interval of said encoded system clock.

20. The apparatus of claim 16, wherein each of said first plurality of pulses is followed by an integer number of said second plurality of pulses, and wherein said integer number is greater than one.

21. The apparatus of claim 16, wherein said encoded system clock includes a third plurality of pulses, wherein said third plurality of pulses correspond to a same duty cycle as said first plurality of pulses, and wherein said third plurality of pulses include encoded information.

22. The apparatus of claim 16, wherein said pulse signal includes a third plurality of pulses, wherein said third plurality of pulses correspond to said first plurality of pulses.

\* \* \* \* \*